(12) United States Patent
Ueda

(10) Patent No.: US 6,744,140 B1
(45) Date of Patent: Jun. 1, 2004

(54) SEMICONDUCTOR CHIP AND METHOD OF PRODUCING THE SAME

(75) Inventor: Shigeyuki Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/665,663

(22) Filed: Sep. 20, 2000

(30) Foreign Application Priority Data

Sep. 20, 1999 (JP) .............................................. 11-265744

(51) Int. Cl.⁷ .......................... H01L 23/28; H01L 23/52; H01L 29/40
(52) U.S. Cl. ...................................................... 257/777
(58) Field of Search ................................ 257/777, 735, 257/666, 737, 780; 438/106, 698, 694; 313/355; 361/773

(56) References Cited

U.S. PATENT DOCUMENTS 5,587,337 A * 12/1996 Idaka et al. .................. 438/613
5,734,199 A * 3/1998 Kawakita et al. ............ 257/737
6,032,356 A * 3/2000 Eldridge et al. ............... 29/843
6,060,768 A * 5/2000 Hayashida et al. .......... 257/666

FOREIGN PATENT DOCUMENTS

| JP | 10-270637 | 10/1998 | |
|----|-----------|---------|---|
| JP | 11-40601 | 2/1999 | |
| JP | 2000-164623 | 6/2000 | |
| JP | 2000-243904 | * 9/2000 | ......... H01L/25/065 |

* cited by examiner

Primary Examiner—W. David Coleman
(74) Attorney, Agent, or Firm—Rabin & Berdo, P.C.

(57) ABSTRACT

A semiconductor chip which is to be overlapped with and joined to a surface of another solid device. The semiconductor chip has a surface protective film for covering internal wiring, an external connection pad which is formed by partially exposing the internal wiring from the surface protective film, and a wire connecting portion which is formed using a metal material having oxidation resistance on the external connection pad and to which a wire for electrical connection to an external terminal is connected. It is preferable that the semiconductor chip further has an internal connection pad used for connection to the solid device and a bump formed on the pad.

10 Claims, 1 Drawing Sheet

SEMICONDUCTOR CHIP AND METHOD OF PRODUCING THE SAME

BACKGROUND OF THE INVENTION

1. Field of the Invention

The present invention relates to a semiconductor chip and a method of producing the same.

2. Description of Related Art

Internal wiring in a semiconductor chip is generally composed of aluminum or the like in order to hold down the production cost. The wiring composed of aluminum or the like is subjected to oxidation by moisture. Therefore, a surface of the wiring is covered with a surface protective film composed of silicon nitride, for example. An opening is formed on the surface protective film to expose a part of the wiring, thereby forming a pad for external connection used for connection to an external terminal such as a lead terminal. An end of a wire composed of gold (Au) for example, is made to adhere and connected to the external connection pad, and the other end of the wire is connected to the external terminal, thereby achieving electrical connection between the wiring in the semiconductor chip and the external terminal.

After the wire is connected to the external connection pad, it is preferable that the surface of the pad is completely covered with the wire. When the adhesion area of the wire on the external connection pad is small, however, the surface of the pad is not completely covered with the wire, so that a part of the pad may remain exposed. Because the pad is composed of aluminum or the like, if the pad is exposed, it may be oxidized by moisture or the like and corroded.

SUMMARY OF THE INVENTION

An object of the present invention is to provide a semiconductor chip in which a pad for external connection may not be corroded irrespective of a connected state of a wire and a method of producing the same.

Another object of the present invention is to provide a semiconductor device having a chip-on-chip structure using the above-mentioned semiconductor chip and a method of producing the same.

A semiconductor chip according to the present invention comprises a surface protective film for covering internal wiring; an external connection pad which is formed by partially exposing the internal wiring from the surface protective film; and a wire connecting portion which is formed using a metal material having oxidation resistance on the external connection pad and to which a wire for electrical connection to an external terminal is connected.

According to the present invention, the wire connecting portion composed of a metal material having oxidation resistance is formed on the external connection pad. In other words, the surface of the external connection pad is covered with the wire connecting portion composed of the metal material having oxidation resistance. Consequently, the external connection pad is not exposed to the exterior irrespective of a connected state of the wire to the wire connecting portion. Accordingly, the external connection pad may not be oxidized by moisture or the like and corroded.

The semiconductor chip may be overlapped with and joined to a surface of another solid device (for example, another semiconductor chip) in a state where the surface protective film is opposed to a surface of the solid device. In this case, it is preferable that the semiconductor chip further comprises an internal connection (chip connecting pad) which is formed by partially exposing the internal wiring from the surface protective film in a portion different from the external connection pad, and a bump formed in a raised state on the internal connection pad (chip connecting pad) using a metal material having oxidation resistance in order to make electrical connection to the solid device.

Furthermore, in this case, it is preferable that the wire connecting portion is composed of the same material as that for the bump. Consequently, it is possible to form the wire connecting portion at the same step as the bump.

A method of producing a semiconductor device according to the present invention is a method of producing a semiconductor chip which is to be overlapped with and joined to a surface of another solid device (for example, another semiconductor chip), comprising the steps of stacking a surface protective film on internal wiring; forming an opening on the surface protective film to partially expose the internal wiring, to form an external connection pad and an internal connection pad (chip connecting pad); and selectively plating (preferably, plating with a material having oxidation resistance) the external connection pad and the internal connection pad (chip connecting pad), to respectively form a wire connecting portion to which a wire for electrical connection to an external terminal is connected and a bump for electrical connection to the other semiconductor chip.

According to the method, the wire connecting portion can be formed at the same step as the bump. Accordingly, the number of steps of producing the semiconductor chip is not increased by providing the wire connecting portion on the external connection pad.

It is preferable that the wire connecting portion is composed of the same material as that for the wire. Consequently, it is possible to improve the adhesive properties of the wire to the wire connecting portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
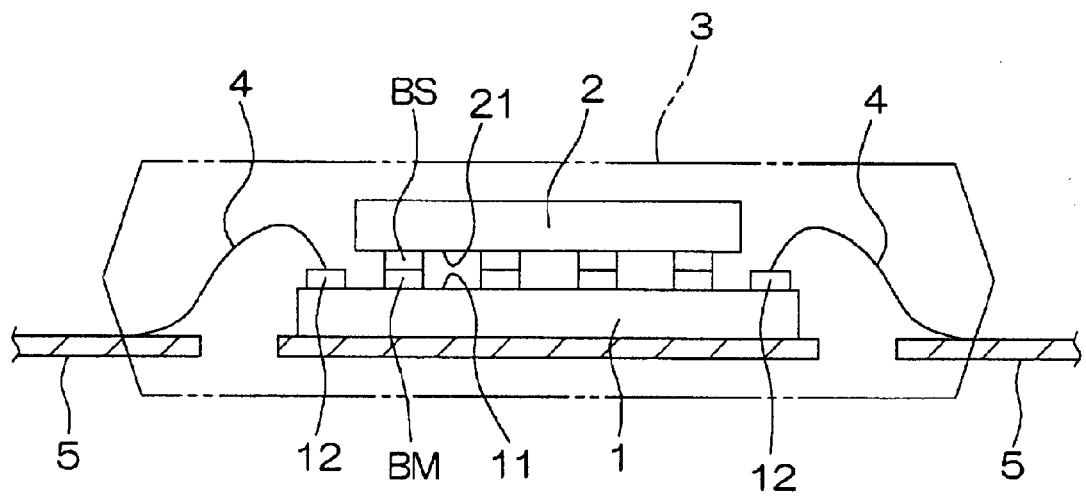
FIG. 1 is an illustrative sectional view showing the schematic structure of a semiconductor device to which a semiconductor chip according to an embodiment of the present invention is applied.

FIG. 1 is an illustrative sectional view showing the schematic structure of a semiconductor device to which a semiconductor chip according to an embodiment of the present invention is applied. The semiconductor device has a so-called chip-on-chip structure, and is constructed by overlapping and joining a secondary chip 2 with and to a surface 11 of a primary chip 1, and containing the primary chip 1 and the secondary chip 2 in a package 3.

The primary chip 1 and the secondary chip 2 are composed of silicon, for example. The surface 11 of the primary chip 1 is a surface, on the side of an active surface layer region where a functional device such as a transistor is formed, of a semiconductor substrate forming a base body of the primary chip 1. The forefront of the surface 11 is covered with a surface protective film (not shown) composed of silicon nitride, for example. On the surface protective film, a plurality of wire connecting portions 12 are arranged in the vicinity of its peripheral edge. The wire connecting portion 12 is connected to a lead frame 5 by a bonding wire 4 composed of gold, for example. Further, a plurality of bumps BM for electrical connection to the secondary chip 2 are arranged on the surface 11 of the primary chip 1.

The secondary chip 2 is joined to the primary chip 1 in a so-called face-down method in which a surface 21 of the secondary chip 2 is opposed to the surface 11 of the primary chip 1. The surface 21 of the secondary chip 2 is a surface, on the side of an active surface layer region where a functional device such as a transistor is formed, of a semiconductor substrate forming a base body of the secondary chip 2. The forefront of the surface 21 is covered with a surface protective film (not shown) composed of silicon nitride, for example. On the surface protective film, a plurality of bumps BS connected to internal wiring are arranged opposite to the bumps BM on the primary chip 1. The bumps BS on the secondary chip 2 are respectively connected to the opposite bumps BM on the primary chip 1. Consequently, the secondary chip 2 is supported with pre-determined spacing held from the surface 11 of the primary chip 1, and is electrically connected to the primary chip 1.

Figure 2:
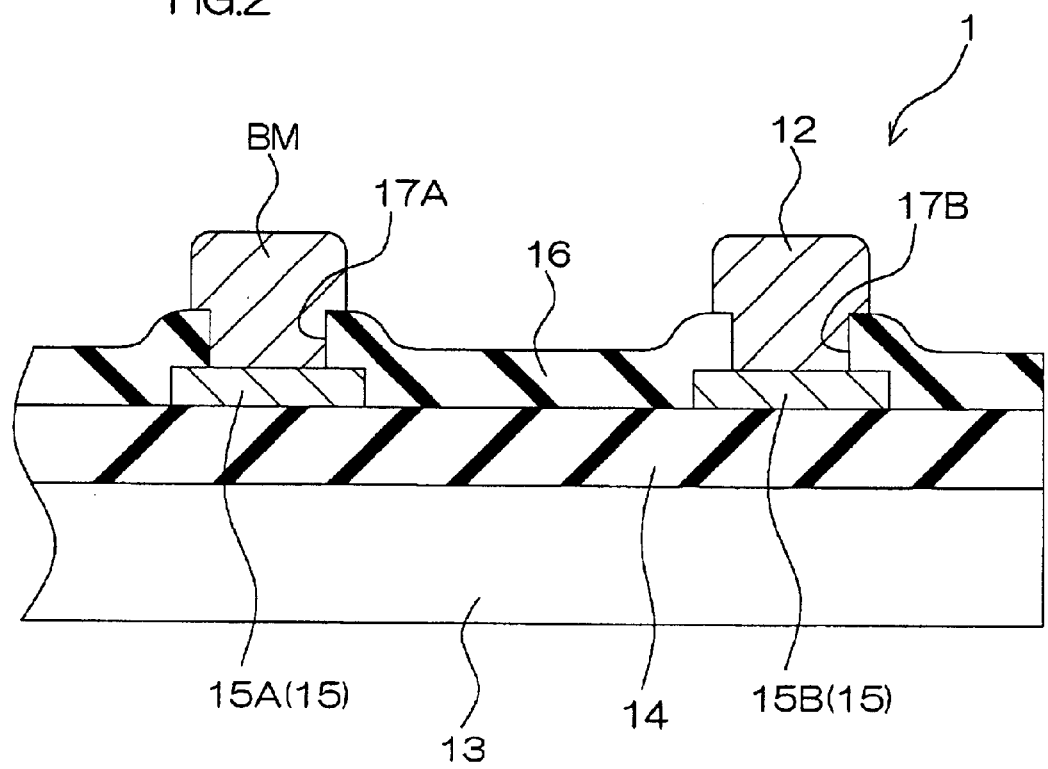
FIG. 2 is a cross-sectional view showing a part of a primary chip provided in the semiconductor device shown in FIG. 1 in enlarged fashion.

FIG. 2 is a cross-sectional view showing a part of the primary chip 1 in enlarged fashion. On a semiconductor substrate 13 forming a base body of the primary chip 1, an interlayer insulating film 14 composed of silicon oxide, for example, is formed. Internal wiring 15 composed of aluminum, for example, is disposed on the interlayer insulating film 14. Surfaces of the interlayser insulating film 14 and the internal wiring 15 are covered with a surface protective film 16 composed of silicon nitride, for example. Openings 17A and 17B are formed on the surface protective film 16 to partially expose the internal wiring 15 from the surface protective film 16, thereby respectively forming an inter-chip connecting pad 15A and a pad for external connection 15B.

On the inter-chip connecting pad 15A formed in the opening 17A, the bump BM composed of a metal having oxidation resistance is formed in a raised state. On the other hand, the external connection pad 15B is formed at a peripheral edge of the primary chip 1. On the external connection pad 15B, the wire connecting portion 12 for connecting the bonding wire 4 (see FIG. 1) is formed in a raised state using a metal having oxidation resistance.

Examples of the metal having oxidation resistance composing the bump BM and the wire connecting portion 12 include gold, platinum, silver, palladium, and iridium. Particularly, gold is preferably used. It is preferable that the wire connecting portion 12 is composed of the same material as that for the bonding wire 4. Consequently, it is possible to improve the adhesive properties of the bonding wire 4 to the wire connecting portion 12.

Furthermore, the bump BM and the wire connecting portion 12 can be formed at the same step using the same material. For example, the openings 17A and 17B are formed on the surface protective film 16, and a seed film is then formed on the surface protective film 16 having the openings 17A and 17B formed thereon. The pattern of a resist film having openings corresponding to the inter-chip connecting pad 15A (the opening 17A) and the external connection pad 15B (the opening 17B) is formed on the seed film, followed by plating with a material for the bump BM and the wire connecting portion 12. Thereafter, the resist film on the seed film is removed, and the seed film exposed by removing the resist film is then removed. Consequently, the bump BM and the wire connecting portion 12 can be respectively obtained on the inter-chip connecting pad 15A and the external connection pad 15B.

As described in the foregoing, according to the present embodiment, the wire connecting portion 12 composed of a metal material having oxidation resistance is formed in a raised state on the external connection pad 15B (wiring 15). In other words, a surface of the external connection pad 15B is covered with the wire connecting portion 12 composed of the metal material having oxidation resistance. The bonding wire for electrical connection to the lead frame 5 is welded to the wire connecting portion 12. Consequently, the external connection pad 15B is not exposed to the exterior irrespective of a connected state of the bonding wire 4 to the wire connecting portion 12. Accordingly, the external connection pad 15B may not be oxidized by moisture or the like and corroded.

Furthermore the wire connecting portion 12 can be formed at the same step as the bump BM by using the same material as that for the bump BM. Even though the wire connecting portion 12 is provided, therefore, the number of steps of producing the primary chip 1 is not increased. However, the bump BM and the wire connecting portion 12 may be respectively composed of different materials. In this case, the wire connecting portion 12 is formed at a step different from the bump BM.

Although description has been made of an embodiment of the present invention, the present invention can be embodied in another embodiment. Although both the primary chip 1 and the secondary chip 2 are chips composed of silicon, for example, they may be semiconductor chips using another arbitrary semiconductor material such as a compound semiconductor (for example, a gallium arsenic semiconductor) or a germanium semiconductor in addition to silicon. In this case, a semiconductor material for the primary chip 1 and a semiconductor material for the secondary chip 2 may be the same or different from each other.

Although in the above-mentioned embodiment, the semiconductor device having a chip-on-chip structure is taken as an example, the semiconductor chip according to the present invention is widely applicable to a semiconductor device having a structure other than the chip-on-chip structure.

Although the present invention has been described and illustrated in detail, it is clearly understood that the same is by way of illustration and example only and is not to be taken by way of limitation, the spirit and scope of the present invention being limited only by the terms of the appended claims.

The application is based on Japanese Patent Application Serial No. 11-265744 filed with the Japanese Patent Office on Sep. 20, 1999, the content of which is incorporated hereinto by reference.

What is claimed is:

1. A semiconductor chip adapted for electrical connection to an external terminal, comprising:
   a semiconductor chip body having a surface with internal wiring disposed thereon, at least one surface area of the internal wiring defining an external connection pad and at least one other surface area different from the at least one surface area of the internal wiring defining an internal connection pad, both the external connection pad and the internal connection pad facing in a same direction as the surface of the semiconductor chip body;

a wire connecting portion fabricated from a metal material having oxidation resistance and electrically connected to the external connection pad;

an electrical contact projection fabricated from a metal material having oxidation resistance and electrically connected to the internal connection pad;

a surface protective film covering the internal wiring and the surface of the semiconductor chip body while contacting the wire connecting portion and the electrical contact projection in a surrounding manner such that a segment of the wire connecting portion and a segment of the electrical contact projection project from the surface protective film; and a wire electrically connected to the segment of the wire connecting portion for connecting the semiconductor chip to the external terminal, wherein the electrical contact projection is in a form of a bump and the wire connecting portion substantially has a shape of the bump.

2. The semiconductor chip according to claim 1, wherein said semiconductor chip is overlapped with and joined to a surface of another solid device in a state where said surface protective film is opposed to a surface of the solid device.

3. The semiconductor chip according to claim 2, further comprising an internal connection pad which is formed by partially exposing said the internal wiring from said surface protective film in a portion of different from said external connection pad, and an electrical contact projection formed in a raised state on the internal connection pad using a metal material having oxidation resistance in order to make electrical connection to the said solid device.

4. The semiconductor chip according to claim 2, wherein said solid device includes another semiconductor chip.

5. The semiconductor chip according to claim 3, wherein said wire connecting portion is composed of the same material as that for said electrical contact projection.

6. A semiconductor device having a chip-on-chip structure in which a secondary chip is overlapped with and joined to a primary chip, wherein said primary chip comprises a primary chip body having a surface with internal wiring disposed thereon, at least one surface area of the internal wiring defining an external connection pad and at least one other surface area different from the at least one surface area of the internal wiring defining an internal connection pad, both the external connection pad and the internal connection pad facing in a same direction as the surface of the primary chip body;

a wire connecting portion fabricated from a metal material having oxidation resistance and electrically connected to the external connection pad;

an electrical contact projection fabricated from a metal material having oxidation resistance and electrically connected to the internal connection pad, the electrical contact projection operative to electrically connect the primary and secondary chips together; and a surface protective film covering the internal wiring and the surface of the primary chip body while contacting the wire connecting portion and the electrical contact projection in a surrounding manner such that a segment of the wire connecting portion and a segment of the electrical contact projection project from the surface protective film, wherein the electrical contact projection is in a form of a bump and the wire connecting portion substantially has a shape of the bump.

7. The semiconductor chip according to claim 6, wherein said wire connecting portion is composed of the same material as that for said electrical contact projection.

8. The semiconductor chip according to claim 6, further comprising a lead frame and a bonding wire, the bonding wire electrically interconnecting the lead frame and the wire connecting portion.

9. The semiconductor chip according to claim 1, wherein the wire connection portion and the electrical contact projection are made of the same material and have simultaneously been formed.

10. The semiconductor chip according to claim 6, wherein the wire connection portion and the electrical contact projection are made of the same material and have simultaneously been formed.

* * * * *